United States Patent [19]
Hong

[11] Patent Number: 5,504,358
[45] Date of Patent: Apr. 2, 1996

[54] ASYMMETRIC NON-VOLATILE MEMORY CELL

[75] Inventor: Gary Hong, Hsin-Chu, Taiwan

[73] Assignee: United Microelectronics Corporation, Hsin-Chu, Taiwan

[21] Appl. No.: 445,943

[22] Filed: May 22, 1995

Related U.S. Application Data

[62] Division of Ser. No. 100,305, Aug. 2, 1993, Pat. No. 5,432,106.

[51] Int. Cl.⁶ .................................................. H01L 29/788
[52] U.S. Cl. .................................... 257/315; 257/322
[58] Field of Search .................................... 257/315, 322, 257/607, 900

[56] References Cited

U.S. PATENT DOCUMENTS

| | | | |
|---|---|---|---|
| 4,771,012 | 9/1988 | Yabu et al. | 437/29 |
| 5,073,514 | 12/1991 | Ito et al. | 437/44 |
| 5,147,811 | 9/1992 | Sakagami | 437/35 |
| 5,158,901 | 10/1992 | Kosa et al. | 437/40 |

OTHER PUBLICATIONS

"Optimization of a Source–Side–Injection FAMOS Cell for Flash EPROM Applications" IEDM '91, pp. 315–318, IEEE (1991).

"¼μm LATID (LArge–Tilted–angle Implanted Drain) Technology" by T. Hori, published in IEDM '89, pp. 777–780.

"Graded–Junction Gate/N–Overlapped LDD MOSFET Structures for High Hot–Carrier Reliability" by U. Okumura et al. Pub. in IEEE Trans on Electron Devices vol. 38, No. 12, Dec. '91 pp. 2647–2656.

Primary Examiner—Mark V. Prenty
Attorney, Agent, or Firm—George O. Saile; Graham S. Jones, II

[57] ABSTRACT

An EPROM memory cell and its fabrication are described. The semiconductor substrate is a first conductivity type. The process begins by forming a conductive gate overlying the substrate, but electrically insulated therefrom by a layer of a first dielectric material. The gate includes a first conductive material, a second layer of dielectric material, and a second conductive layer. A sidewall dielectric spacer is formed adjacent to an edge of the gate. Ions are implanted into the substrate of a species of an opposite conductivity type, at a substantial acute angle relative to a vertical angle with respect to the substrate, with the spacer protecting the substrate from ion implantation adjacent to the gate. Alternatively, the sidewall can be formed subsequent to the second deposition of doping ions at an acute angle.

1 Claim, 3 Drawing Sheets

ASYMMETRIC NON-VOLATILE MEMORY CELL

This is a division of U.S. application Ser. No. 08/100,305 filed Aug. 2, 1993 and now U.S. Pat. No. 5,432,106.

BACKGROUND OF THE INVENTION

1. Field of the Invention

This invention relates to semiconductors and more particularly to MOSFET memory devices.

2. Description of Related Art

Currently a method of making a source-side injection EPROM/Flash EPROM cell is to use a one side spacer (oxide or polysilicon) which needs a critical masking step to etch one side of a spacer away.

There are several known ways of making asymmetric EPROM or flash memory structures which require critical alignment masking steps with all the known problems attendant therewith such as D. Liu, et al, "Optimization of a Source-Side-Injection FAMOS cell for Flash EPROM Applications" IEDM 91 315-318, IEEE (1991).

There is a technology called large tilted angle ion implantation which allows ion implantation to be preformed at angles other than the vertical, that is 0°. This technique has been used to make various MOSFET LDD integrated circuit devices. The U.S. Pat. Nos. 4,771,012 to Yabu et al; 5,073,514 to Ito et al; 5,158,901 to Koss et al and 5,147,811 of E. Sakagami all show the sue of tilted angle ion implantation to make integrated circuit devices. U.S. Pat. No. 5,147,811 describes the formation of a P region under a gate using LATID and then a vertical ion implantation to form the N+ S/D regions. The publication "¼ µm LATID (LArge-Tilted-angle Implanted Drain) TECHNOLOGY" by T. Hori, published in IEDM 89 pages 777/780 and "Graded-Junction Gage/N− Overlapped LDD MOSFET Structures for High Hot-Carrier Reliability" by U. Okumura et al published in the IEEE Transactions on Electron Devices, Vol. 38, No. 12, December 1991 (pages 2647–2656) show further use of tilted angle ion implantation. These references all use single tilted angle ion implantation to improved device performance.

U.S. Pat. No. 5,073,513 of Ito et al discloses the formation of an LDD MOSFET using LATID to form the N− and then uses vertical ion implantation to form the N+ region.

An object of this invention is a process which avoids any critical masking steps needed to fabricate an asymmetric, non-volatile memory cell.

In accordance with this invention a semiconductor is formed using a Large-Angle-Implant (LAI) process to generate an off-set region for formation of an asymmetric source/drain region that can enhance the programmability by using the characteristics of source-sided injection in programming operations.

SUMMARY OF THE INVENTION

An EPROM memory cell on a semiconductor substrate doped with a dopant of a first conductivity type and a method of forming the cell, comprises the steps of:

a) forming a first layer of dielectric material on the substrate, b) forming a conductive gate overlying the dielectric material, c) the gate being formed by the steps of 1) depositing a first conductive material on the first dielectric material, 2) forming a second layer of dielectric material on the first conductive material, and 3) depositing a second conductive layer on the second layer of dielectric material, the conductive gate being electrically insulated from the substrate by the first layer of dielectric material, and d) performing an angular ion implantation into the substrate of a dopant of an opposite conductivity type from the substrate, at a substantial acute angle relative to a vertical angle with respect to the substrate.

Preferably, the first conductive material comprises a floating gate. Preferably, the EPROM memory cell wherein the conductive layers consist essentially of doped polysilicon. Preferably, the acute angle is an angle selected between about 15 and 45 degrees. Preferably, the EPROM memory cell is held in fixed position rotationally during the ion implantation process. Preferably, the EPROM memory cell wherein sidewall dielectric spacers are formed adjacent to an edge of the gate prior to the angular ion implantation. Preferably, the EPROM memory cell wherein sidewall dielectric spacers are formed adjacent to an edge of the gate subsequent to the angular ion implantation.

BRIEF DESCRIPTION OF THE DRAWINGS

The foregoing and other aspects and advantages of this invention are explained and described below with reference to the accompanying drawings, in which:

FIG. 6 shows the product of the process illustrated in FIG. 2 and shows the Large Angle ion implantation of N+ ions prior to formation of the spacers. In FIG. 7 spacers have been formed. First and second sidewall dielectric spacers are Juxtaposed adjacent to the first edge and the second opposing edge, respectively of the gate of the EPROM cell.

DESCRIPTION OF THE PREFERRED EMBODIMENT

Figure 1:
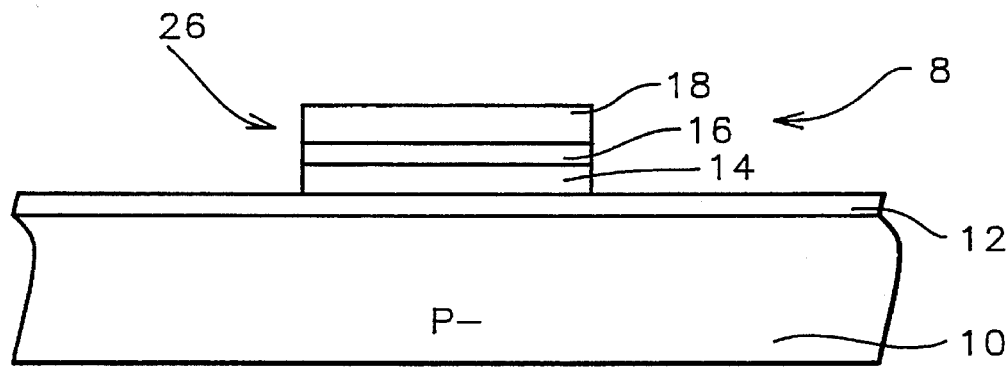
FIG. 1 shows a sectional view of an EPROM cell.

FIG. 1 shows a sectional view of an EPROM cell 8. Cell 8 includes a semiconductor substrate 10 composed of silicon lightly doped with boron P− sub or P− well. A thin layer of gate oxide 12 is deposited upon the substrate 10. The oxide has a thickness of between about 100 Å and about 300 Å. The oxide is deposited by the process of thermal oxidation at a temperature of about 800° C. to about 900° C. in a furnace.

Next, a gate 26 composed of layers including lower conductor layer 14 which serves as a floating gate, dielectric layer 16 and upper conductor layer 18 which serves as a control gate is formed by a series of steps. Lower conductor layer 14 which forms the lower portion of the gate 26 of EPROM cell 8 composed of polysilicon 1 (poly 1) is deposited having a thickness of about 1500 Å on top of gate oxide layer 12. Lower conductor layer 14 comprises a heavily doped layer of polysilicon formed preferably by thermal decomposition of silane ($SiH_4$) in a reactor at a temperature between about 580° C. and about 650° C. at between about 0.2 and about 1.0 Torr using 100% silane or a diluted mixture of between about 20% and about 30% silane in nitrogen at about the same pressure, as described in Sze, VLSI Technology, McGraw Hill Book Company pp. 238–239 (1988).

Next an interconductor dielectric layer 16 composed preferably of oxide-nitride-oxide (ONO) or another suitable interpoly dielectric or oxide is deposited. The lower oxide is formed by thermal oxidation of about 150 Å at a temperature of from about 900° C. and about 1000° C. The nitride layer is deposited in a thickness of about 150 Å at a temperature of between about 700° C. and about 800°C. The top oxide is formed by thermal oxidation between about 20 Å and about 50 Å at a temperature of between about 900° C. and about 1000° C. employing wet oxidation for ten minutes.

An upper conductor layer 18 of polysilicon 2 (poly 2) or polycide, having a thickness of about 4000 Å, forms the upper portion of EPROM cell 8. The upper conductor layer 18 is formed on top of dielectric layer 16. Upper conductor layer 18 can comprise a heavily doped layer of polysilicon formed by thermal reduction of $SiH_4$ in the same way as polysilicon 1 lower conductor layer 14. Polycide is commonly used for the polysilicon 2 (word line.)

Figure 2:
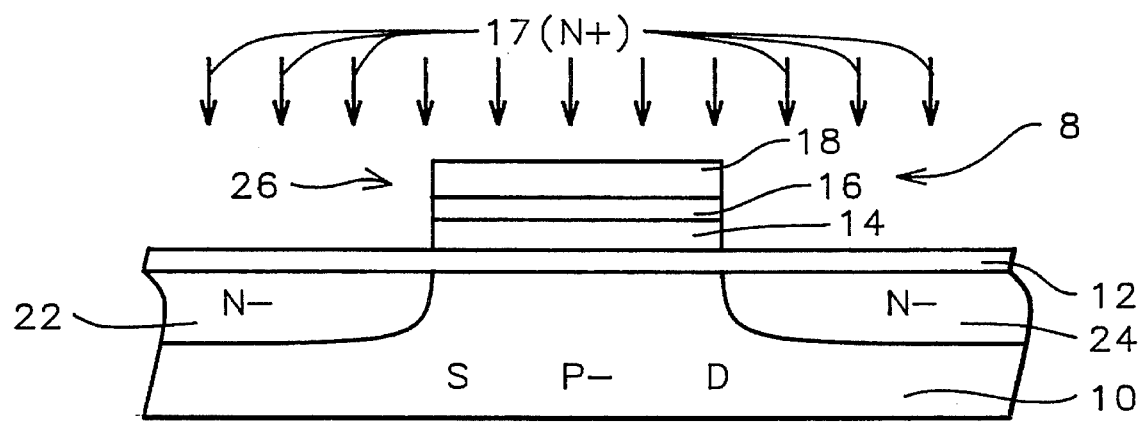
FIG. 2 shows the cell of FIG. 1 after a first an ion implantation has been performed with ions directed at a substantially normal (perpendicular) angle to the surface of the substrate forming the first regions of the source and the drain.

In FIG. 2, an ion implantation is performed with ions directed at a substantially normal (perpendicular) angle to the surface of the substrate 10. The implantation forms (near the surface of the substrate 10) the regions 22 and 24 doped N−. Eventually N− is used only for the source side, not major source/drain regions. The N+ ions 17 are applied with the following parameters: chemical species of the dopant implanted is arsenic (As) or phosphorous (P) with a dose within the range of between about $10^{13}$ cm$^{-2}$ and about $10^{14}$ cm$^{-2}$, an energy within the range of about between about 50 keV and about 100 kev in a conventional type of tool, and the implantation is applied at an angle substantially normal to the surface of the substrate 10, and in any event is not applied at a large angle.

Figure 3:
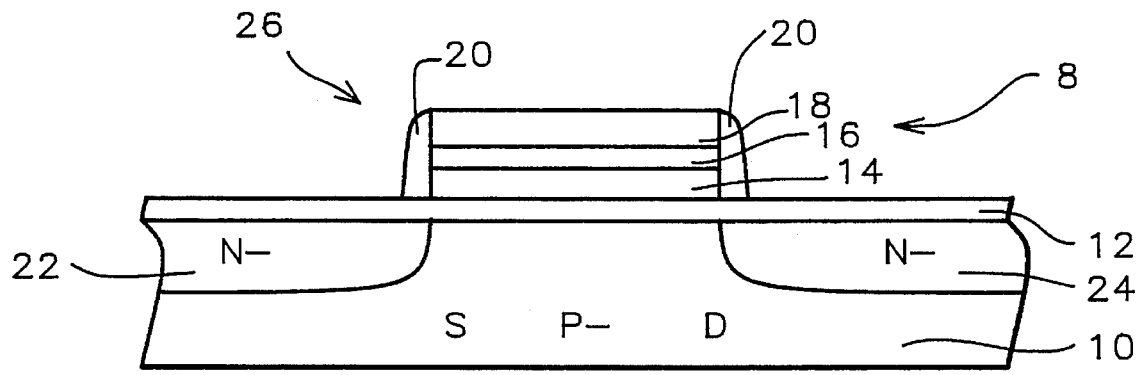
FIG. 3 shows the product of FIG. 2 after dielectric spacers have been formed adjacent to the gate.

In FIG. 3 spacers 20 have been formed. First and second sidewall dielectric spacers 20 are juxtaposed adjacent to the first edge and the second opposing edge, respectively of the EPROM cell 8. The spacers 20 are formed by CVD deposition of $SiO_2$. The $SiO_2$ is deposited in a reactor to a thickness within the range of between about 2000 Å and about 3000 Å by CVD (chemical vapor deposition) from gases selected from the group consisting of a reactant gas selected from the group consisting of $SiH_4$, $O_2$ and $N_2$ with the carrier gas comprising $N_2$. Alternatively, please refer to Sze "VLSI Technology McGraw Hill Book Company (1988) page 235 for deposition processes for silicon dioxide.

Figure 4:
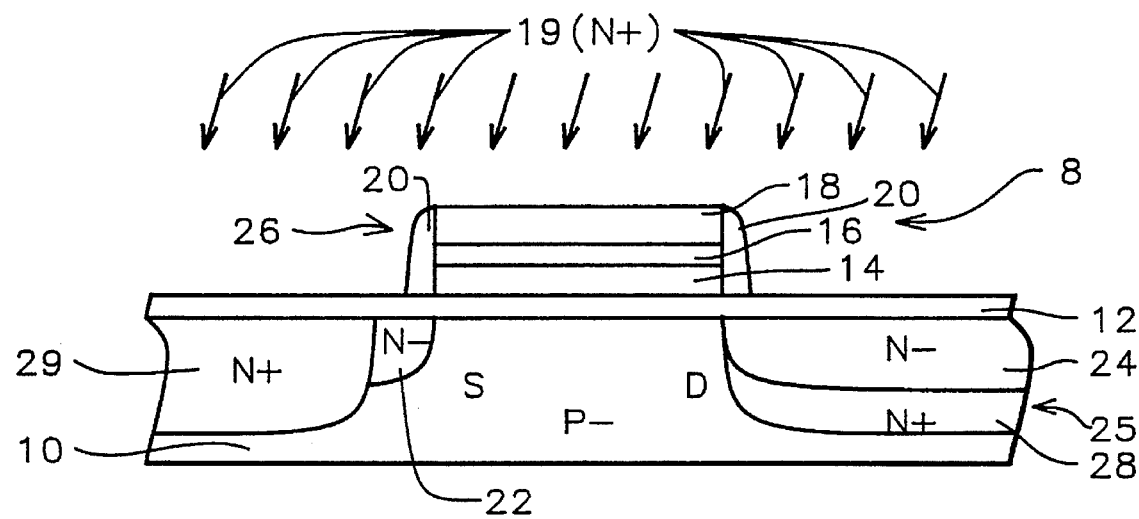
FIG. 4 shows the product of FIG. 3 after the second source and drain ion implantation is made using the process of Large-Angle-Implant (LAI.)

In FIG. 4, the source and drain ion implantation is shown with N+ ions 19 being applied using the process of Large-Angle-Implant (LAI) between about 15 and 45 degrees to generate an off-set in Source/Drain regions 22, 25 in the substrate 10 of the EPROM device. During the process of FIG. 4 N+ ions are implanted into the source region 22 forming N+ region 29 and the forming the N+ lower region 28 below region 24 of drain 25. Region 28 is offset from the gate 26 by the LAI angle forming the N+ region 28 below the N− region 24. The chemical species of the dopant implanted is arsenic (As) with a dose within the range of between about $1\times10^{15}$ cm$^{-2}$ and about $5\times10^{15}$ cm$^{-2}$, an energy of within the range of between about 50 keV and about 100 keV in a type of implanter tool performing a high current, large-angle-implantation process.

Figure 5:
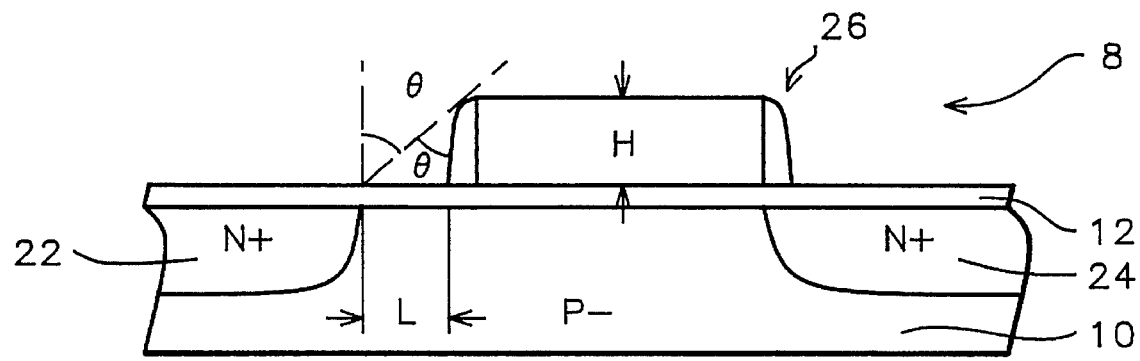
FIG. 5 shows a schematic diagram of the dimensions of the profile of an EPROM memory transistor.

FIG. 5 shows a schematic diagram of the dimensions of the profile of an EPROM memory transistor. The height of the gate 26.structure is "H." A distance "L" extends from the periphery of the spacer 20 to the source region 25. A line drawn from from the inner border of the source region 25 to the nearest edge of the top edge of spacer 20 forms a line at the angle $\Theta$, which is the angle at which the arsenic (As) N+ ions are implanted. The relationship between the parameters defined above is stated by equation (1).

$$L = H \times \tan \Theta$$

$$L \approx 0.2 \; \mu m \tag{1}$$

In the practical application illustrated by FIGS. 1–4, an example of thicknesses of the layers of the gate 26 are as follows:

| | | |
|---|---|---|
| polysilicon 2 | (layer 18) | 2000 Å |
| ONO | (layer 16) | 500 Å |
| polysilicon 1 | (layer 14) | 2000 Å |
| | TOTALS | 4500 Å |

Applying the above thickness of 4500 Å which serves as the height H in equation 1 and assuming that L is to be about 2000 Å, and choosing $\tan \Theta = 0.445$, to balance the equation (1) as below $$L = H \times \tan \Theta = 4500 \; \text{Å} \times 0.445 = 2002 \; \text{Å} \tag{2}$$

we find that angle $\Theta = 24°$ giving $\tan \Theta = 0.445$.

Thus in this example, the desired value of L is about 2000 Å which determines the desired result. One can adjust H and/or $\Theta$ to get other desired values of L.

Manifestly to achieve the desired result it is required that the wafer and wafer holder be retained in fixed angular position without rotation during the LAI process. The interpoly dielectric layer 16 is protected by the polysilicon 2 upper conductor layer 18 and the sidewalls 20 during the LAI.

Figure 6:
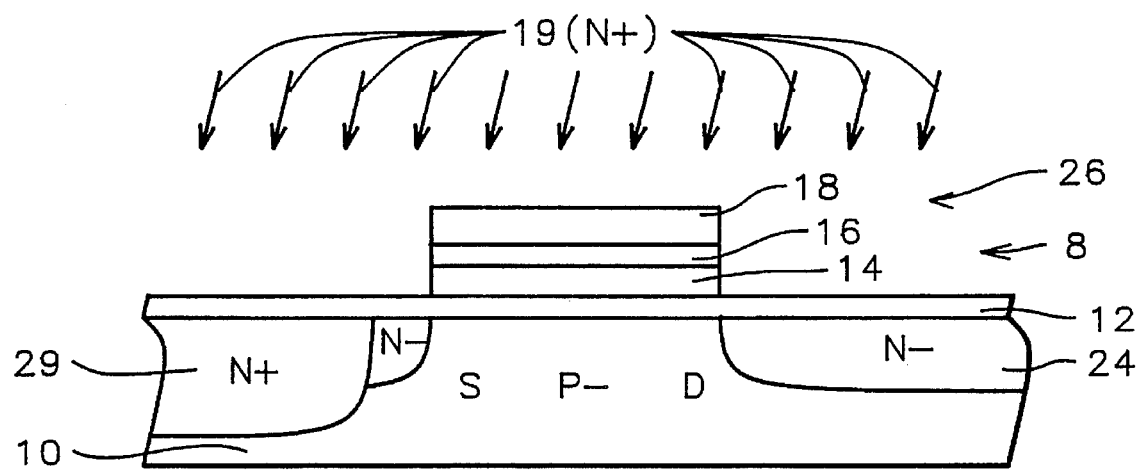
FIGS. 6 and 7 show an alternative method to the process of FIGS. 1–4 wherein the spacer is absent during large angle ion implantation as illustrated in FIG. 6.
Figure 7:
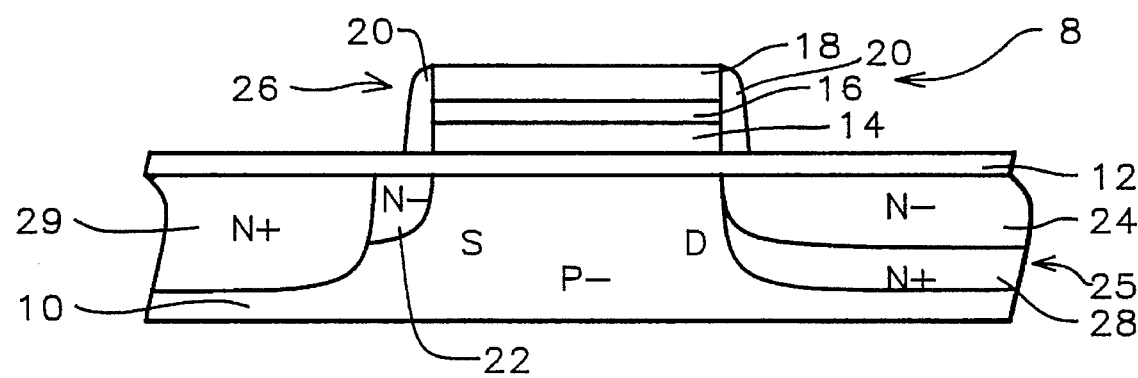

FIGS. 6 and 7 show an alternative method to the process of FIGS. 1–4 wherein the spacer is absent during large angle ion implantation as illustrated in FIG. 6. The spacer is formed later as shown in FIG. 7.

FIG. 6 takes the product of the process illustrated in FIG. 2 and performs the Large Angle ion implantation of N+ ions 19. The source and drain ion implantation is shown with N+ ions 19 being applied as above using the process of Large-Angle-Implant (LAI) between about 15 and 45 degrees to generate an off-set in Source/Drain regions 22, 25 in the substrate 10 of the EPROM device. Next N+ ions are implanted into the source region 22 and the drain region 25. Drain region 25 is offset from the gate 26 by the LAI angle.

In FIG. 7 spacers 20 have been formed. First and second sidewall dielectric spacers 20 are juxtaposed adjacent to the first edge and the second opposing edge, respectively of the gate 26 of EPROM cell 8.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An EPROM memory cell on a semiconductor substrate doped with a dopant of a first conductivity type, comprising:
   a) a first layer of dielectric material on said substrate,
   b) a conductive gate overlying said dielectric material,
   c) said gate being formed of
      1) a floating gate comprising a first conductive material formed on said first dielectric material,
      2) a second layer of dielectric material formed on said first conductive material, and
      3) a second conductive layer on said second layer of dielectric material, said conductive gate being electrically insulated from said substrate by said first layer of dielectric material, and
      4) a first ion implanted region in said substrate formed by ions directed at an angle substantially normal to the surface of said substrate,
      (5) sidewall dielectric spacers adjacent to an edge of said gate,
   d) an angular ion implanted region in said substrate implanted with a dopant of an opposite conductivity type from said substrate, at a substantial acute angle relative to a vertical axis with respect to said substrate, an N+ source region and a drain region, with said N+ source region spaced from said spacer by a distance L where the height of said gate is H, a distance L extends from the periphery of said spacer towards a source region and a line drawn from the inner border of said source region to nearest edge of the top edge of said spacer forms an angle $\Theta$ which is said substantial acute angle in accordance with the equation:

$$L = H \times \tan \Theta,$$

an EPROM memory cell wherein said conductive layers consist essentially of doped polysilicon and said first implantation of dopant implanted is a dopant selected from the group of dopants consisting of arsenic (As) and phosphorous (P) with a dose within the range of between about $10^{13}$ cm$^{-2}$ and about $10^{14}$ cm$^{-2}$, implanted at an energy within the range of about between about 50 keV and about 100 keV, and the implantation was applied at an angle substantially normal to the surface of the substrate, whereby large-angle-implant regions are off-set providing an asymmetric source/drain region that can enhance programmability by using the characteristics of source sided injection in programming operations.

* * * * *